United States Patent
Pennock et al.

(10) Patent No.: US 6,828,845 B2
(45) Date of Patent: Dec. 7, 2004

(54) ANALOGUE SELECTOR

(75) Inventors: John L. Pennock, Edinburgh (GB); Edward M. Granville, Edinburgh (GB)

(73) Assignee: Wolfson Microelectronics Limited, Edinburgh (GB)

( * ) Notice: Subject to any disclaimer, the term of this patent is extended or adjusted under 35 U.S.C. 154(b) by 0 days.

(21) Appl. No.: 10/347,300

(22) Filed: Jan. 21, 2003

(65) Prior Publication Data

US 2004/0100319 A1 May 27, 2004

(30) Foreign Application Priority Data

Nov. 26, 2002 (GB) .............................................. 0227553

(51) Int. Cl.[7] .............................................. H03K 17/76
(52) U.S. Cl. ........................ 327/403; 330/278; 370/916
(58) Field of Search ................................ 327/407, 408, 327/403, 404; 370/916; 330/282, 278, 284

(56) References Cited

U.S. PATENT DOCUMENTS

| | | | | |
|---|---|---|---|---|
| 4,236,088 A | * | 11/1980 | Horiuchi et al. | ............ 327/407 |
| 5,157,348 A | * | 10/1992 | Deveau | ...................... 330/279 |
| 5,387,879 A | | 2/1995 | Satoh | |
| 5,915,066 A | * | 6/1999 | Katayama | .................... 386/70 |
| 5,973,566 A | | 10/1999 | Leiby | |
| 6,160,893 A | * | 12/2000 | Saunders et al. | .......... 381/71.6 |

OTHER PUBLICATIONS

Maki Sato, et al., "A Volume and Tone Control IC for Hi–Fi Audio", *IEEE Journal of Solid–State Circuits*, vol. SC–16, No. 6, Dec. 1981, pp. 682–689.

Todd L. Brooks, et al., 'A Cascaded Sigma–Delta Pipeline A/D Converter with 1.25 MHz Signal Bandwidth and 89 dB SNR, *IEEE Journal of Solid–StateCircuits*, vol. 32, No. 12, Dec. 1997, pp. 1896–1906.

\* cited by examiner

*Primary Examiner*—Timothy P. Callahan
*Assistant Examiner*—Cassandra Cox
(74) *Attorney, Agent, or Firm*—Dickstein Shapiro Morin & Oshinsky LLP

(57) ABSTRACT

The present invention relates to analogue selectors, also known as analogue multiplexers, for audio equipment input source selection. The present invention provides an analogue input selector for selecting one of a number of analogue source devices. The selector comprises a plurality of input connections for coupling to the input sources, each said input connection being connected to a gain controller having at least zero and one or more non-zero gains, said input connection not including a semiconductor switch. Preferably the gain controllers are implemented using MOSFETs which are held at a voltage which is independent of the signal voltage.

17 Claims, 7 Drawing Sheets

PRIOR ART

ANALOGUE SELECTOR

FIELD OF THE INVENTION

The present invention relates to analogue selectors, also known as analogue multiplexers, especially though not exclusively as implemented in integrated circuits for audio equipment such as hi-fi amplifiers.

BACKGROUND OF THE INVENTION

Analogue input selectors have many applications, including for example in audio entertainment equipment such as home hi-fi, in-car entertainment and portable equipment which normally provide for a choice of audio sources such as a CD player, tape deck or radio for example. Such equipment also typically routes audio input signals to one or more outputs, for example headphones, loudspeakers, tape recorders and digitisers. This is typically implemented using a bank of input selectors, one for each output.

With increasing equipment miniaturisation, analogue selectors are typically implemented as Integrated Circuits (IC) utilising MOSFET switching technology. MOSFET's such as CMOS are used because of their low leakage current compared with other types of transistor switch technology. FIG. 1 shows a typical circuit arrangement for an analogue input selector having programmable gain. Programmable or variable input gain is used because of the different signal levels provided from the different types of analogue sources. For example a record deck might provide a few millivolts rms whereas a standard "line" output from audio equipment provides typically 2V rms. A CMOS selector switch is provided for each input source, and the CMOS gain selector switches are arranged according to what signal level the selected input source delivers. The output signal level of the analogue selector should therefore be similar irrespective of the input source.

A problem with this arrangement is that the use of CMOS type switches in the IC results in signal level dependent distortion as illustrated in FIG. 2. This is because the resistance of the CMOS switch is dependent on the voltages from drain and source to the gates, which voltages are not constant in the selector switches because the drain and source voltages rise and fall with the signal whereas the gate voltages are related to the supply rail voltages which are fixed.

A solution to this problem is to increase the size of the selector switch in order to reduce its input impedance relative to other, constant, series impedances in the circuit, and hence reduce the voltage across the drain/source, and hence reduce the relative effects of any modulation of the CMOS switch resistance. However larger switches require more IC real-estate which increases cost and also increases undesirable parasitic capacitances, which can degrade power-supply rejection for example.

Another proposed solution to this problem is described in M. Sato, K. suzuki, T. Suzuki, and K. Akutsu, "A Volume and Tone Control IC for Hi-Fi Audio", IEE J Solid-State Circuits, Vol SC-16, No. 6, December 1981. p682–688. This document describes the use of very high sheet resistance material for the gate electrodes. The local gate Voltage is then capacitively coupled to the channel at signal frequencies to maintain an approximately constant gate-channel voltage. But this requires unusual manufacturing steps, which increases cost and such processing is not readily available. It also introduces delays when switching from one channel to another and so this idea has not been adopted.

A further solution is described in T. L. Brooks et al "A Cascaded Sigma-Delta Pipeline A/D Converter with 1.25 MHz Signal Bandwidth" in IEEE Journal of Solid-State Circuits, Vol.32, No.12, December 1997—see especially pages 1901–2. This uses a charge pump architecture which effectively boosts the gate voltage above the supply rail depending on a previously sampled signal level in order to try to maintain a substantially constant source/drain to gate voltage difference. However this architecture introduces a requirement for high speed clocking which can itself be a source of distortion and switching transients added to the signal. The extra complexity of the circuitry will also increase chip area, and hence cost. There is also some reliability risk, both for the switch and whatever circuit drives the gate drive, involved in charge-pumping the voltages possibly higher than the normal supply voltage

SUMMARY OF THE INVENTION

In general terms in one aspect the present invention aims to provide an analogue selector in which the gate to source or drain voltages of transistors such as MOSFETs used as semiconductor switches are held constant by holding the source or drain terminals at a fixed or signal independent voltage, such as virtual earth. This means that these voltages do not vary as the signal voltages vary. This is achieved by replacing the selection switch coupled between each input connection and a gain stage with a gain stage for each input connection. The gain stage for the chosen input channel operates with one of its constituent MOSFET switches turned on and connected to a virtual earth or other supply related voltage in order to provide a substantially constant source and drain to gate voltage. By removing the floating voltage selection switches, distortion caused by the switch resistance varying with the source and drain to gate voltages is substantially eliminated.

For the purposes of this specification, the terms drain, source and gate are used for simplicity and clarity of explanation, but are intended to encompass corresponding structures having similar functions in non-FET switches. For example the terms drain, source and gate are intended to encompass the collector, emitter and base structures in bipolar junction transistors as well as similar structures with the same function in other types of semiconductor devices.

In particular in one aspect the present invention provides an analogue selector according to claim 1.

Such an arrangement provides that the input coupling stage of the analogue selector does not require the selector switch for each input and thus a significant source of distortion is removed. The switching function is now performed by the input gain stages or controllers. Whereas large selector switches are typically used in order to reduce signal level dependent distortion, and their physical size is further increased by layout precautions to allow them withstand directly applied ESD and latch-up stresses, removal of these by the present arrangement also saves valuable IC real-estate.

Preferably the gain stages or controllers comprise one or more semiconductor switches each having a source or drain coupled to the virtual earth of the selector.

This arrangement provides the switches with a fixed source and drain to gate voltage as the virtual earth is related to the supply rail voltages and not the signal voltages. Such an arrangement takes up relatively little IC real-estate as small switch configurations can be used because the switches carry substantially no signal current and are not directly exposed to external ESD or latch-up stresses In one embodiment the selector comprises an amplifier such as an op amp having an input and an output, and each gain stage or controller further comprises an impedance chain coupled between the amplifier output and a respective input connection, the switches being coupled between the chain and the amplifier input. Alternatively each gain stage may comprise a dedicated amplifier such that the whole op amp input stage is duplicated per-channel and switched in as required.

An impedance chain is typically implemented as a series of discrete impedance devices such as resistors, from which taps of different combined impedance can be taken at different points along the chain, for example at the connections between discrete impedances.

This allows multiple gain factors to be selected using a simple impedance chain such as a series of resistors, the switches being coupled between resistor connections and the amplifier input. If the switches are all left open (zero gain), this deselects the input signal.

In an alternative arrangement, one or more of the gain controllers may comprise just one switch with impedance coupled between the switch the respective input and further impedance coupled between the switch and the amplifier output. Such an arrangement provides just two gain settings, zero (off) and non-zero (on); and thus acts as a simple input selector without adjustable non-zero gains.

Preferably the selector further comprises means for shorting each of the gain stages to a reference voltage when at zero gain. This reduces the possibility of any cross-talk between the input circuits.

Preferably the shorting means comprises one or more switches coupled between each impedance chain and a reference voltage. Preferably the amplifier has a second input connected to the reference voltage.

When implemented as an integrated circuit, preferably the shorting means further comprises another switch which is independently routed from said other shorting means switches to said reference voltage.

Since the selector switches pass substantially no signal current, they can be physically small. The resistance requirements on the shorting switches are also modest, since these are not in the direct signal path. In both cases an NMOS or PMOS switch is adequate, which take up little IC real-estate.

In a second aspect the present invention provides a multiplexed programmable gain amplifier. This comprises a plurality of input connections for coupling to a number of input sources. Each input connection is connected to a programmable gain stage having at least zero and one or more non-zero gains. Preferably each programmable gain stage has one or more semiconductor switches each having a non-gate input coupled to the virtual earth of the selector. Preferably each programmable gain stage has an impedance chain which is coupled between an amplifier output and a respective input connection. The switches are coupled between the chain and the input of the amplifier.

Further implementations and advantages of the present invention will become apparent from the following description of embodiments.

BRIEF DESCRIPTION OF THE DRAWINGS

Embodiments of the present invention will now be described in detail with reference to the following drawings, by way of example only and without intending to be limiting, in which.

DETAILED DESCRIPTION

Figure 1:
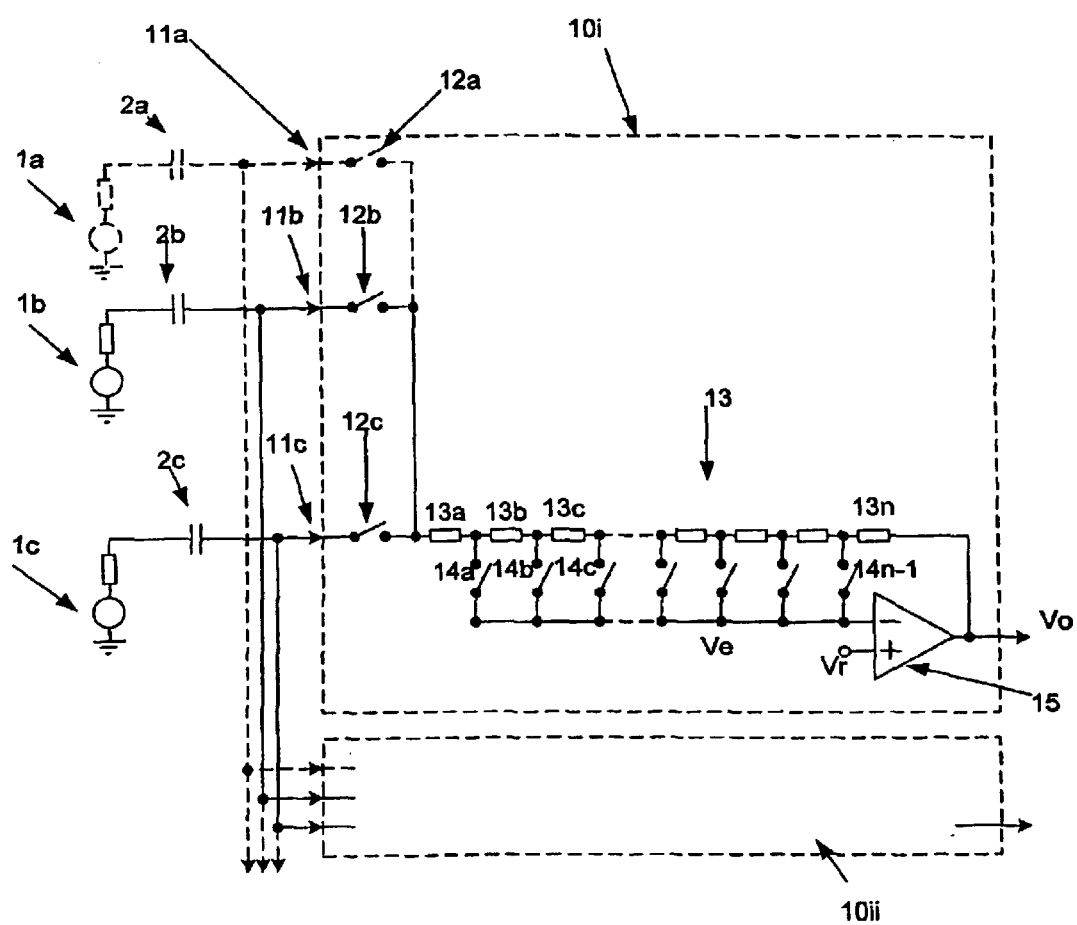
FIG. 1 shows a known architecture for an analogue selector.

Referring to FIG. 1, a known analogue selector or multiplexer architecture is shown. Several such selectors $10i$, $10ii$ are typically incorporated into audio equipment or the like in order to route signals from a number of analogue input sources 1 such as CD players and microphones to several outputs. Each selector 10 comprises a plurality of input connections 11 for connecting to the input sources 1. Each input source 1 is also connected to other selectors 10 in order to allow multiple way switching between the input sources and the outputs of the audio equipment.

Each selector 10 has a selection or input switch 12a–12c one side of which is coupled to a respective input source 1a–1c using respective input connections 11a–11c. The other side of each input switch 12a–12c is connected to a resistor chain or string 13 comprising a number of discrete resistors 13a–13n in series. The other end of the chain 13 is coupled to the output (Vo) of an op amp 15, which also provides the output from the selector circuit 10. A number of gain switches $14a–14n_{-1}$ tap-off the resistor chain 13, each from the connection between two resistors 13a–13n. The other ends of the switches 14 are connected to the inverting input (−) of the op amp 15.

By changing the on/off status of these gain switches 14, the signal gain provided by the op amp 15 is varied by virtue of the negative feedback arrangement the resistor/switch network provides. Thus for high level input sources 1 the gain of the op amp 15 can be reduced, so that a normalised output signal level (Vo) is provided from the selector 10 irrespective of input source level.

Typically only one of switches 14a–14n-1 will be closed. For instance if switch 14b is closed, then the gain will be given by Vout/Vin=−(R13c+R13d+ . . . +R13n)/(Rs+R12c+R13a+R13b)

Where Vout=output signal voltage amplitude at node (Vo)

Vin=input signal voltage amplitude generated by equivalent signal voltage source (1c)

Rs=equivalent signal source impedance (1c and 2c)

R12c, R14b=on-resistance of MOSFET switches (12c and 14b)

R13a, R13b, . . . =resistances of resistors R13a, R13b, . . . , respectively

In principle, more than one of switches 14a–14n-1 could be closed, shorting several segments of resistor chain 13 in order to provide additional gain settings. However in practice the operation is kept simple by just selecting one switch at a time.

Figure 2:
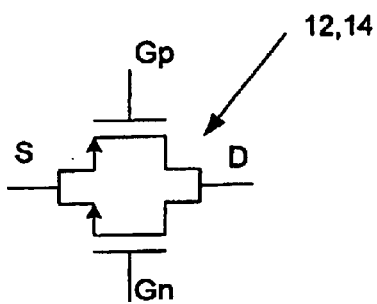
FIGS. 2a–2d show a schematic diagram of a CMOS device and graphs of conductance characteristics for various operating conditions of the device.
Figure 2:
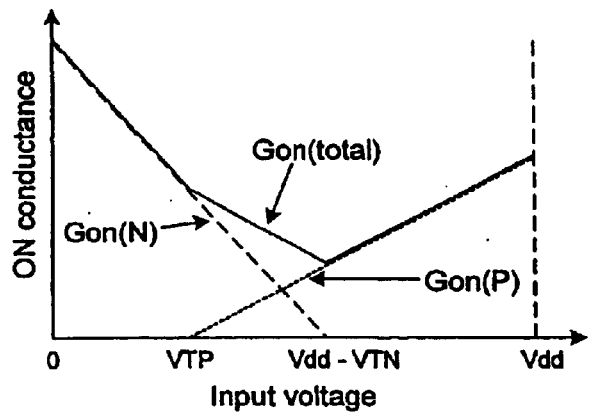
Figure 2:
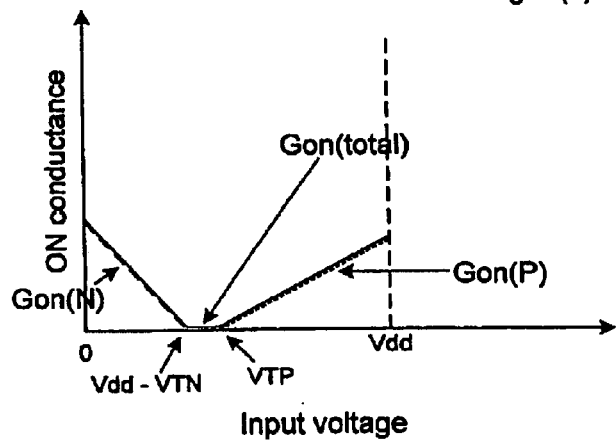
Figure 2:
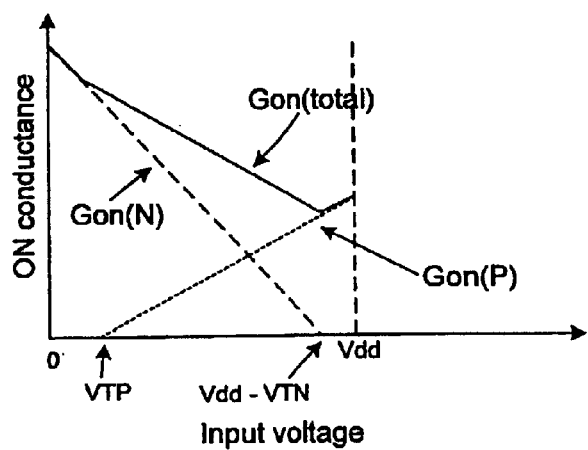

FIG. 2a shows a CMOS transmission gate device which comprises a PMOS and an NMOS part and is typically used for the switch implementation (12, 14) in the above described selector 10. The device (12, 14) comprises a source S and drain D which are coupled to the other circuit components in the selector 10, as well as a PMOS and an NMOS gate Gp and Gn to control the conductance of the PMOS and NMOS parts of the device.

When the PMOS gate Gp is high (+ve supply, Vdd) and the NMOS gate Gn is low (−ve supply, earth or ground), then both NMOS and PMOS parts of the device are off. When the PMOS gate is low and the NMOS gate high, both parts are on. Additionally, the PMOS part will be off when the drain D and source S are at ground (or less than the PMOS threshold voltage Vtp above ground), and the NMOS part will be off when the drain and source are at Vdd (or less than the NMOS threshold voltage Vtn below the +ve supply Vdd). These characteristics are shown in the conductance graph of FIG. 2b.

It can be seen that the drain—source conductance varies with the drain and source voltage. In other words, the conductance characteristics of the device vary with the voltage at the drain and source.

Referring again to FIG. 1, it can be seen that the drain and source voltages of the selection switch devices 12a–12c will vary with the input signal which in turn will cause the gain of the circuit to vary as the input signal swings high and low (as R12c varies relative to Rs+R13a+R13b in the above example), i.e. causing signal dependent modulation of the voltage gain. This gives rise to distortion of the output signal.

FIG. 2c shows the characteristics of a CMOS transmission gate used in portable audio equipment where the supply voltage (Vdd) is typically lower than non-portable equipment in order to conserve battery life. It can be seen that the device actually switches off for some levels of input voltage, resulting in even more distortion.

This problem can be mitigated to some extent by adding steps to the silicon manufacturing process to allow the threshold voltage of selected transistors to be lower than normal, say 300 mV rather than 800 mV. A CMOS switch comprising such low threshold transistors will have somewhat improved characteristics as shown in FIG. 2d. However over temperature and normal manufacturing tolerances, such transistors may start to turn on or at least leak significantly at Vin (at node 11a, 11b, . . . )=Vdd or ground. So if a large audio signal is applied to an unselected input, or if there is an accidental or intentional shorting of an input to ground or supply, or even a transient as equipment is attached or removed to external terminal, this may lead to an audible breakthrough of this interfering signal superimposed on the selected audio signal.

Especially as this effect would not happen with a purely mechanical switch, this would be unacceptable to many users.

Figure 3:
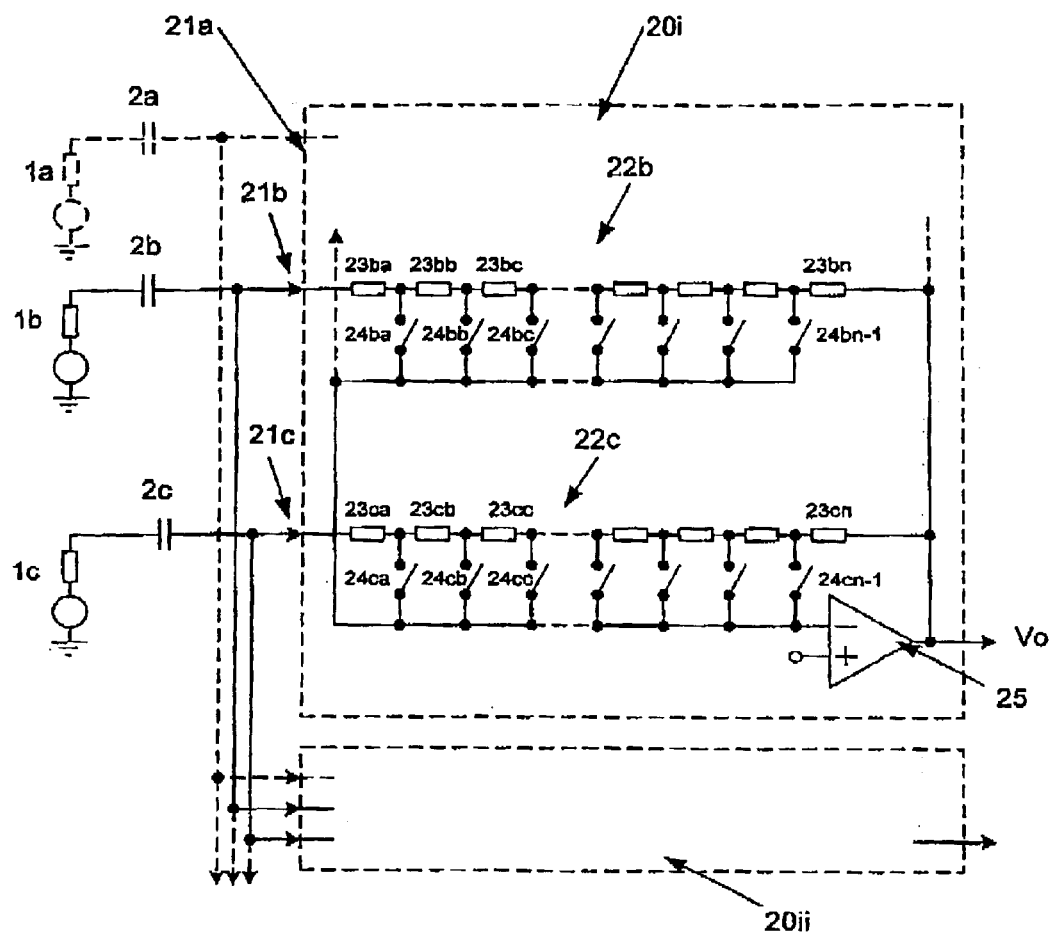
FIG. 3 shows an architecture for an analogue selector in accordance with an embodiment of the invention.

FIG. 3 shows an analogue selector 20 according to a first embodiment of the present invention. The selector 20 is coupled to a number of input sources 1a–1c via input connections 21a–21c respectively. Each input connection 21a–21c is connected to a respective gain controller 22a–22c. Each gain controller 22a–22c comprises a respective impedance chain having a number of discrete impedances 23a–23n such as resistors. Gain switches 24a–24n-1 tap off the impedance chain from between resistors 23a–23n to the inverting input (−) of an op amp 25. The output (Vo) of the op amp 25 is connected to each gain controller 22 (at resistor 23n) to form a negative feedback loop for input signal amplification. By controlling the gain switches 24, different numbers of resistors 23 are switched into the feedback loop and the signal input path in order to control the input signal gain. The gain is determined as described above with respect to the circuit FIG. 1.

By having all of the gain switches 24 of a gain controller 22 open, the signal from a corresponding input source 1 is not passed to the op amp 25 and hence is not amplified (zero gain). By having only one gain controller (22c) with closed gain switches (preferably only one of 24ca–24cn), only the corresponding input source 1c is passed to the op amp 25 for amplification. Thus the gain switches 24 also act as the input selector function.

The multiple gain controllers 22, each connected to a respective input source 1, perform the input selection function as well as the gain control function and in doing so dispense with the need for the selector or input switches (12) used in the arrangement of FIG. 1. This in turn removes the signal level dependent gain and hence the associated distortion of the output signal.

Because each of the gain switches 24 are connected to the high impedance op amp inverting input (−), they do not pass any signal current (except for a negligible amount needed to drive the small (~1 pf) input capacitance of the op amp). Also since the switch is connected to this virtual earth, the source and drain voltage of each CMOS switch is substantially constant and is related to the supply voltages and not the signal level so their on-resistance is independent of the signal. Therefore small CMOS switches 24 can be used which together with the resistor chains 23 take up little IC real-stat. In fact, when on, the source and drain voltages are known and constant, so the CMOS switch can be replaced by simply a NMOS or PMOS switch, further sang the area of both the omitted transistor and its redundant drive circuitry and interconnect. Also, if the switches are say all NMOS, the input signal can swing above the positive supply voltage without forward-biasing the parasitic drain-substrate diode of the (now omitted) PMOS, avoid possible latch-up or damage of the circuit on power-up or otherwise, and allowing bigger peak input signals.

The input switches in FIG. 1 are generally required to pass input signals with voltages from near positive supply to near negative supply, and thus have to be CMOS switches, i.e. an NMOS and PMOS in parallel. However the gain selector switches and the shorting switches of the present embodiment have a fixed drain and source voltages, so only an NMOS or a PMOS is necessary for each switch, halving the number of transistors and removing the need to generate complementary drive signals to these switches, this reducing silicon area and cost.

A farther advantage can be seen by returning to FIG. 1, where the switches 12 are directly connected to the external connections or pins of the integrated circuit. This means they are directly exposed to external stresses such as ESD pulses or accidentally applied current pulses. Typically these inputs are required to withstand ESD pulses of at least 2 kV and injected current of +/−200 mA without latching up or suffering permanent damage. Some of the stress may be absorbed by protection diodes from the imputs to the supplies, but because the input diffusions are directly connected to the pins, typically about half of the stress has to be absorbed in the switches Thus the input switch transistors 12 will have larger than normal dimensions (e.g. from the metal contact to the input diffusion to the gate of the transistor) and will be surrounded by guard-ring diffusions or other structures to divert any parasitic currents directly back to the supply pins rather than being picked up by internal circuitry. They also require appropriately low-impedance metal connections to carry a continuous 200 mA fault current. Thus these switches will occupy substantial silicon area.

By comparison, the first switch 24*ca* in FIG. 3 is isolated from the external input 21*c* by resistor 23*ca*, typically at least 1 kohm. Practically all of the stress will now be absorbed by the input protection diodes (not shown), with less than a milliamp flowing through resistor 23*ca* into the diffusions of switch 24*a*, so minimal special precautions need to be taken as regards guard-rings for switch 24*ca*. This further reduces the IC real estate required as well as cost.

The physical size of the additional resistor banks are typically limited by the matching tolerances obtained by the photographic and other steps of the manufacturing process, which is improving rapidly with time as general dimensions scale, whereas the dimensions of devices required to withstand the physical stresses are limited by tolerable maximum current densities in overstress conditions, and do not improve significantly as the process shrinks. Thus the IC real estate required to implement the gain controllers 22 of the present embodiment will continue to shrink with improvements in the fabrication process, whereas the size of the equivalent selection switches in the prior art will remain roughly the same.

Another advantage of the embodiment is that the impedance level of the resistor string attached to each channel may be independently designed. For example one channel may be designed with a high impedance value to suit a relatively high-impedance signal source 1, whereas another channel can be designed with a lower impedance level to improve thermal noise. Also different channels may have different numbers or types of gain laws. If one or more channels are to be connected to a dedicated source with a known signal level, that channel can have a fixed gain, and have only two resistors 23 and one switch 24.

A number of selectors 20*i*–20*ii* can be connected in parallel as indicated depending on how many outputs are required.

Typically, the non-inverting input (+) of op amp 25 will be biased by a well-decoupled bias voltage half-way between the positive and negative supplies of the op amp 25. This maximises the peak-to-peak voltage swing available at the op amp output before overload. The negative supply in a low-voltage integrated circuit will normally be ground, so this bias voltage will be a midrail, voltage Vdd/2 where Vdd is the positive supply voltage, say 3.3V.

If such a single-supply scheme is used, then the quiescent voltage at the selected input 21*c* must also be Vdd/2, whereas the input signal 1*c* will generally be quiescently ground voltage. Thus the capacitor 2*c*, shown in FIG. 3, is required to couple the input signal. The d.c. bias voltage on the selected input 21*c* will then be obtained via resistor chain 23*c* without the need for any additional bias resistors.

Quiescently, the voltage on the unselected inputs 21*b* etc will also be Vdd/2, via the respective resistor chain 23*b* etc. Thus capacitor 2*b* will be precharged, and will not require charging up when inputs are switched from one channel to another. This helps to avoid large voltage transients, audible as undesirable pops and bangs, when the inputs are switched. (Note the circuit of FIG. 1 would require extra switches from each unselected channel to Vdd/2, preferably via a medium resistance (>1 kohm) to avoid shorting and overloading the input signal source).

Figure 4:
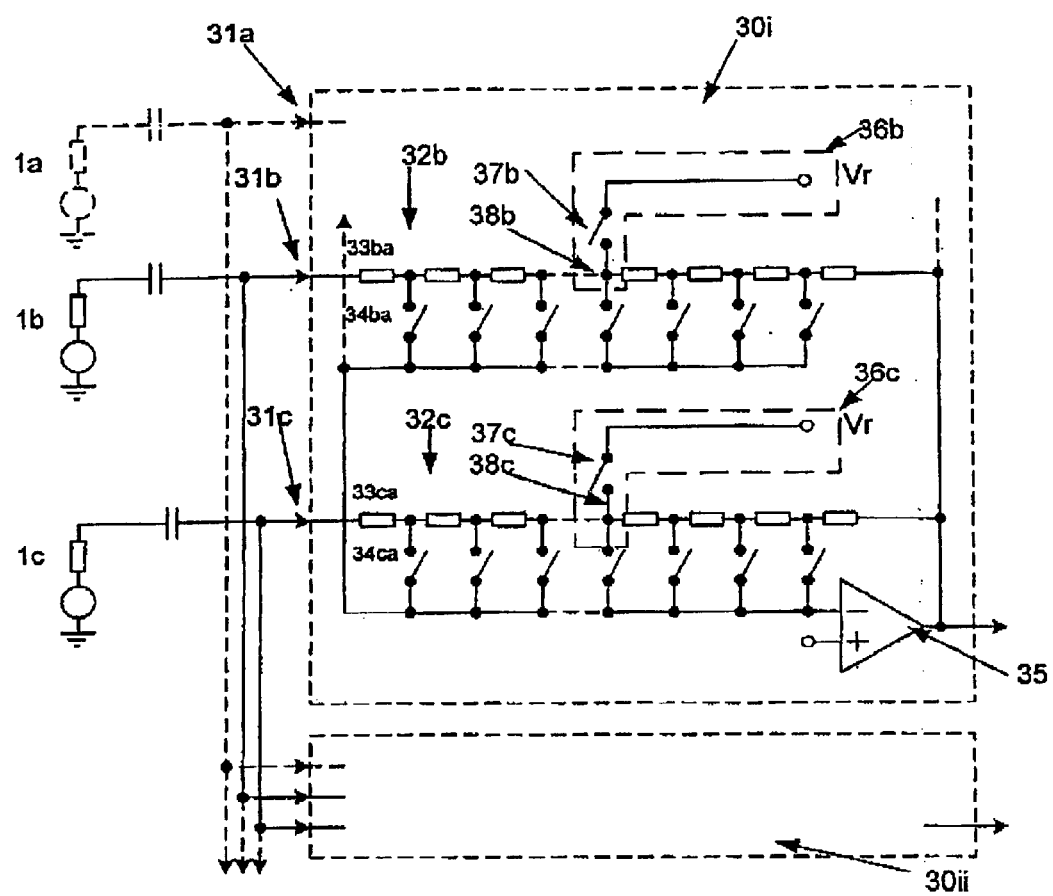
FIG. 4 shows an architecture in accordance with another embodiment.

FIG. 4 shows a further embodiment which is similar to that of FIG. 3, but additionally has means 36 for shorting each impedance chain 33 to a reference voltage Vr. For clarity, only some of the common components of FIGS. 3 and 4 are referenced in FIG. 4. FIG. 4 addresses a potential problem of the previous embodiment of FIG. 3 where there is coupling of the output signal from the op amp output back to unselected inputs via the respective resistor string. For example, if the resistor string is 60 kohms in total, and the source impedance is 600 ohms, the selected input signal will appear at node 21*b* attenuated by only 600 ohms/60.6 kohms ~40 dB. If this signal on 21*b* is also to be used in a parallel channel via 20*ii* (.e.g. for recording one signal while listening to another), this crosstalk would be unacceptable.

The reference voltage Vr is typically the mid-rail bias voltage referred to in the previous embodiment, to maintain the correct quiescent voltage on unselected a.c. coupled inputs The shorting circuit 36*a*–36*c* is activated for each unused gain controller 32, that is for all of the unselected inputs or all of the gain controllers except for the gain controller (32*c*) associated with the selected input (1*c*). Each shorting circuit 36*a*–36*c* comprises a connection 38*a*–38*c* to a respective impedance chain 33*a*–38*c*, preferably to a central point within the chain 33. A switch 37*a*–37*c* is coupled to a respective connection 38*a*–38*c*, and in turn is coupled to the reference voltage Vr. The shorting switch (37*a*, 37*b*) is closed on each shorting circuit (36*a*, 36*b*) which is connected to an "unselected" gain controller (32*a*, 32*b*).

This arrangement reduces the possibility of cross talk between the input "channels" of the various selectors 20*i*, 20*ii*. If the source 1 impedance associated with an unused impedance chain 33 is high, then the input connection 21 or left end of the chain 33 will have a small signal swing superimposed on it. This in turn can be presented at the input of another selector 20*ii* which has selected that source 1, so causing cross talk. The shorting circuits 36 act to short out this superimposed signal on unused chains 33 to prevent this cross talk.

If switch 37*b* were zero impedance, then the output signal would be completely suppressed at node 38*b*. However, typically a small switch at this node would still have say 1 kohm impedance. If this point is half-way along a 60 kohm sting, and the source impedance is 600 ohms, the signal will be attenuated by approximately 1 kohm/30 kohm =30 dB at 38*b*, and a further 600 ohm/30 kohm=34 dB by the time it gets to 31*b*. This is still only a total of 64 dB.

Figure 5:
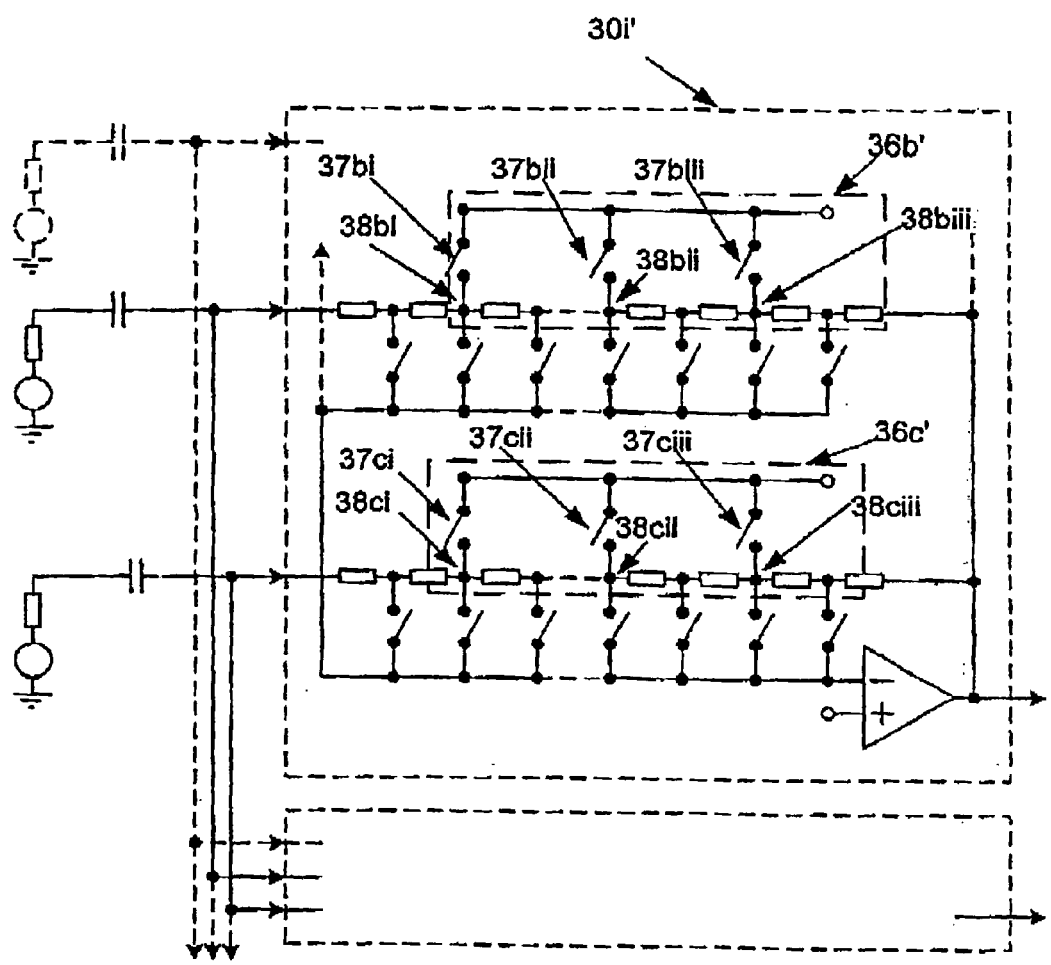
FIG. 5 shows an enhancement to the architecture of FIG. 4.

A further enhancement of this embodiment is shown in FIG. 5, which shows a selector 30' according to FIG. 4, but in which the shorting means 36' comprises multiple shorting switches 37*i*, 37*ii*, 37*iii*. This further reduces cross talk by reducing the overall impedance of each shorting circuit 36'.

For example if the connections 38*i*, 38*ii*, 38*iii* have taps spaced 15 kohm apart, the total attenuation is approximately:

(1 kohm/15 kohm)*(1 kohm/15 kohm)*(1 kohm/15 kohm)*(600 ohm/15 kohm)=23.5+23.5+23.5+28 dB=98.5 dB, which is an acceptable level, comparable with other inevitable parasitic coupling effects between devices pins or PCB connections.

Figure 6:
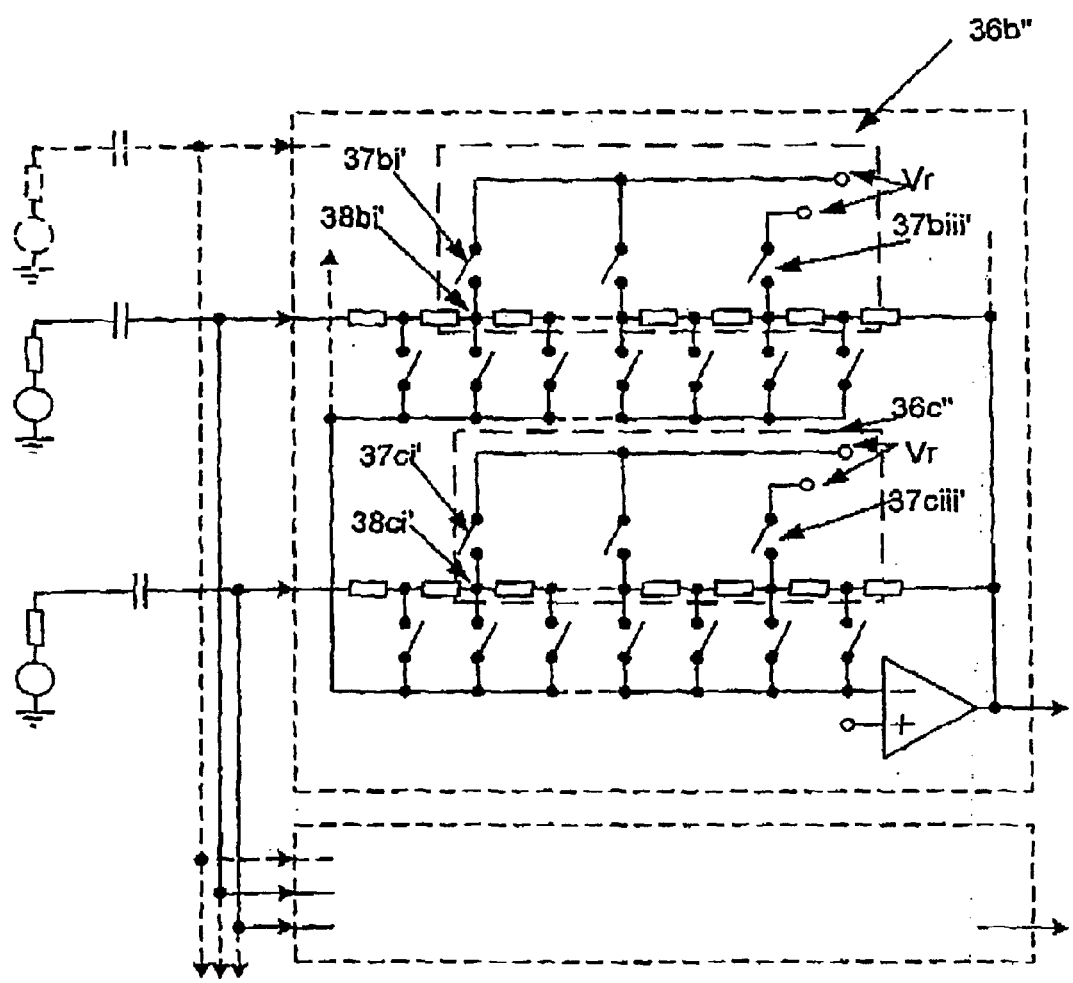
FIG. 6 shows a further enhancement to the architecture of FIG. 5.

FIG. 6 shows a yet further enhancement of a shorting circuit 36" which reduces cross-talk. The shorting switches 37*iii* closest to the op amp output (Vo) will take significant signal current. For example for a 1 Vrms output audio signal and a 15 kohm resistor segment as above, it will take 66 uArms of signal current. If the source impedance of Vr is one ohm, the resulting 66 uVrms component will be applied to all the Vr terminals, including the other switches and the virtual earth in this and other selector stages. This signal is only 83 dB below the 1 Vrms level. If applied to the virtual earth of an op amp of another selector block 20*ii*, with a different selected signal, even at unity gain, this cross-talk signal will be doubled (since the gain from positive input to output in this configuration=2), to give an unacceptable cross-talk of 77 dB. This cross-talk could be even greater when more selector blocks are added. Similar cross talk will be caused by similar ripple appearing on the shorting switches of other channel selector blocks. Allowing for on-chip metal routing, typically 50 ohms per mm for a 1 um wide track, it is hard to get a source impedance of less than several ohms, without uneconomic excessively wide metal tracks.

Figure 7:
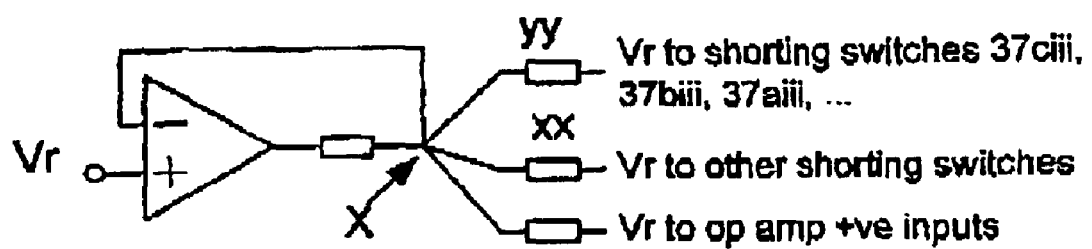
FIG. 7 shows a buffer circuit for a reference voltage supply.

The arrangement of FIG. 6 and 7 reduces this potential cross-talk. FIG. 7 shows a buffer circuit for supplying the reference voltage V. The open-loop output impedance of an op amp buffering the reference voltage Vr will generally be reduced to a fraction of an ohm by heavy negative feedback to a node X The right hand shorting switches or the shorting switches 37iii closest to the op amp 35 in each impedance chain 33 are routed by on-chip metal interconnect with resistance represented by resistor yy, back to node X. The other shorting switches, and preferably the op amp (35) virtual earths are routed back via independent metal tracks (with resistance represented by resistor xx) to node X. Signal-dependent currents will pass through the shorting switches and through the respective interconnect resistances (xx and yy), possibly tens of ohms, to node X. There will be significant voltage ripple generated across the resistances, but the voltage at node X will move much less, since its impedance will generally be say 0.1 ohm, rather than tens of ohms. Depending on gain selector impedances, cross-talk specifications, numbers of channels, distances from node X to the switches, it may also be necessary to connect shorting switches from separate channel selectors independently.

This arrangement avoids the above cross-talk effect by star connecting the respective metal tracks back to an appropriate point (X). This provides a reference buffer with an output impedance of less than a few ohms without having to route this round a chip as such routing would require very wide metal (using a large silicon area). The right hand shorting switch 37iii carries by far the most current (due to the 1 Vrms at the opamp output). It is this current coupled with the metal routing impedance that generates the majority of the signal cross-talk to the reference node. The effects of this are reduced by routing this back separately to the decoupled reference buffer output. The other switches, passing much less current, can tolerate higher impedance return paths without introducing significant crosstalk.

Further, depending on circuit layout and parasitics, it may also be advantageous to route the reference voltage terminals of the left-hand switches (37bi' etc.) independently back to the star point X. This is to avoid cross-talk from one unused channel inputs to another unused channel input via the "left-most" part of each of the respective resistor chains, which may be noticeable if the second of these channels were used in a different selector block.

As discussed above for the gain selector switches, since the Vr voltage is mid-rail, a full CMOS transmission gate is not necessary for the shorting switches, and an NMOS (or a PMOS, but typically an NMOS will have lower resistance for the same size) is sufficient The semiconductor switches referred to in the above description have been assumed to be MOSFETs. These components are available in standard low-cost widely-available CMOS silicon integrated circuit technology, are simple to drive, and provide low leakage current. However, other semiconductor devices could be used, for example enhancement-mode JPETs or MESFETS. Bipolar transistors could also be used in analogous configurations.

The selectors described above are preferably used in audio equipment such as hi-fi amplifiers or in-car stereos for selecting from a number of audio input sources, however other applications are also contemplated, for example multichannel precision telemetry.

A method of operating the selectors is also provided in order to select a particular input source and in order to set an appropriate gain factor for that source. A source is selected by opening all switches on the gain controllers not associated with the selected input source. In addition an appropriate gain factor is applied to the selected input source by closing an appropriate gate on the gain controller associated with the selected input source.

The invention has been described with reference to embodiments thereof. Alterations and modification as would be obvious are intended to be incorporated within the scope hereof.

What is claimed is:

1. An analogue input selector for selecting one of a number of analogue source devices, the selector comprising:
   a plurality of input connections for coupling to said analogue source devices, each said input connection being connected to a respective gain controller having at least one zero and two or more discrete non-zero gains, there being no semiconductor switch between said input connections and said gain controllers.

2. A selector according to claim 1 wherein each said gain controller comprises one or more semiconductor switches each having a source or drain coupled to a voltage independent of the input signal.

3. A selector according to claim 2 wherein the voltage independent of the input signal is the virtual earth of the selector.

4. A selector according to claim 3 further comprising an amplifier having an input and an output and wherein each said gain controller further comprises an impedance chain coupled between said amplifier output and a respective said input connection, said switches being coupled between said chain and said amplifier input.

5. A selector according to claim 4 further comprising means for shorting each said gain controller to a reference voltage when at zero gain.

6. A selector according to claim 5 wherein said shorting means comprises a switch coupled between a said impedance chain and said reference voltage.

7. A selector according to claim 6 wherein said amplifier has a second input connected to said reference voltage.

8. A selector according to claim 7 wherein said shorting means further comprises one or more second switches coupled between said impedance chain and said reference voltage.

9. A selector according to claim 2 wherein said switches are MOSFETs.

10. A selector according to claim 8 wherein said switches are MOSFETs.

11. A selector according to claim 2 wherein said switches are NMOS switches.

12. An integrated circuit comprising a selector according to claim 1.

13. An integrated circuit comprising a selector according to claim 6.

14. An integrated circuit according to claim 13, wherein said shorting means further comprises a third switch is independently routed from said other shorting means switches to said reference voltage.

15. Audio equipment comprising an integrated circuit according to claim 12.

16. Audio equipment comprising an integrated circuit according to claim 14.

17. A method of operating a selector comprising a plurality of input connections for coupling to a plurality of analogue source devices, each said input connection being connected to a respective gain controller having at least one zero and two or more discrete non-zero gains; the method comprising:

selecting one of said analogue source devices by providing that the respective gain controller has a non-zero gain and by providing that the other gain controllers each have a zero gain.

* * * * *